US012328954B2

(12) United States Patent
Si et al.

(10) Patent No.: US 12,328,954 B2
(45) Date of Patent: Jun. 10, 2025

(54) SHINGLED SOLAR MODULE WITH RIBBON INTERCONNECT

(71) Applicant: Maxeon Solar Pte. Ltd., Singapore (SG)

(72) Inventors: Jianfang Si, Kunshan (CN); Yafu Lin, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/441,049

(22) Filed: Feb. 14, 2024

(65) Prior Publication Data
US 2024/0186436 A1  Jun. 6, 2024

Related U.S. Application Data

(62) Division of application No. 18/075,885, filed on Dec. 6, 2022, now Pat. No. 11,923,473.

(51) Int. Cl.
| | | |
|---|---|---|
| H10F 19/90 | (2025.01) | |
| H02S 20/25 | (2014.01) | |
| H10F 71/00 | (2025.01) | |

(52) U.S. Cl.
CPC .......... *H10F 19/904* (2025.01); *H02S 20/25* (2014.12); *H10F 71/1375* (2025.01)

(58) Field of Classification Search
None
See application file for complete search history.

(56) References Cited

U.S. PATENT DOCUMENTS

| | | | |
|---|---|---|---|
| 11,923,473 B1 | 3/2024 | Si et al. | |
| 2010/0218800 A1* | 9/2010 | Cousins | H01L 31/1804 136/244 |
| 2012/0305047 A1* | 12/2012 | Taira | H01L 31/022433 136/244 |
| 2013/0167910 A1* | 7/2013 | DeGroot | H01L 31/0504 136/251 |
| 2019/0081185 A1 | 3/2019 | Lee | |
| 2019/0312163 A1 | 10/2019 | Lu | |
| 2021/0143290 A1 | 5/2021 | Lin | |
| 2021/0328079 A1 | 10/2021 | Haque | |
| 2022/0173261 A1* | 6/2022 | Bettinelli | H10F 71/137 |
| 2022/0216357 A1* | 7/2022 | Pujari | H01L 31/0516 |
| 2023/0144536 A1 | 5/2023 | Jeong | |

* cited by examiner

*Primary Examiner* — Daniel P Malley, Jr.
(74) *Attorney, Agent, or Firm* — Schmidt Patent Law, Inc.

(57) ABSTRACT

A high efficiency configuration for a solar cell module comprises solar cells arranged in an overlapping shingled manner and methods for assembling solar cells in a shingled manner. Solar cells in the module are electrically connected in series by front side ribbons and separate rear side ribbons. The front-side ribbons have a smaller cross-sectional width while the rear-side ribbons are thinner and wider.

6 Claims, 12 Drawing Sheets

SHINGLED SOLAR MODULE WITH RIBBON INTERCONNECT

CROSS REFERENCE TO RELATED APPLICATIONS

The present application is a divisional application of U.S. patent application Ser. No. 18/075,885 filed on Dec. 6, 2022, which is incorporated herein by reference in its entirety.

FIELD OF THE INVENTION

The invention relates generally to solar cell modules or panels in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to conductive regions on the solar cell to direct an electrical current from the cell to an external circuit. When solar cells are combined in an array such as a solar cell module, the electrical energy collected from all of the solar cells can be combined in series and parallel arrangements to provide power with a desired voltage and current.

SUMMARY

This specification discloses solar cell modules which have crystalline silicon solar cells arranged in a shingled manner. Each crystalline silicon solar cell in the solar cell module has a front metallization pattern comprising a plurality of front conductive fingers oriented parallel to a long edge of the front surface, a front pad located at the long edge of the front surface and electrically connected to the front metallization pattern, and a front-side ribbon disposed on the plurality of front conductive fingers and on the front pad where the front side ribbon oriented parallel to a short edge of the front surface and having a cross-sectional width. Each crystalline silicon solar cell in the solar cell module also has a rear surface having a rear metallization pattern having comprising a plurality of rear conductive fingers oriented parallel to a long edge of the rear surface, a rear-side ribbon separate from the front-side ribbon which is disposed on the plurality of rear conductive fingers and has a cross-sectional width that is 2 times larger than the cross-sectional width of the front side ribbon. The crystalline silicon solar cells in the solar cell module are electrically connected in series by having the rear-side ribbon of one solar cell contact the front pad of an adjacent solar cell. In some embodiments, the rear-side ribbon has a cross-sectional width that is 3 times larger than the cross-sectional width of the front side ribbon. The cross-sectional width of the rear side ribbon may vary from 0.5 mm to 3 mm.

In some embodiments, the rear-side ribbon of one solar cell may be soldered to the front pad of an adjacent cell. In other embodiments, the rear-side ribbon makes contact with the front pad of an adjacent cell without use of adhesive, solder, or other bonding agent.

In some embodiments, the rear-side ribbon may extend past the edge of solar cell. This allowed the overlap distance between adjacent solar cells in the module to be less than 0.1 mm but still greater than zero.

In some embodiments, the front-side ribbon of one solar cell does not directly contact the rear-side ribbon of an adjacent solar cell. In other embodiments, the front-side ribbon of one solar cell directly contacts the rear-side ribbon of an adjacent solar cell.

In some embodiments, the front-side ribbon has a circular cross-sectional shape. In other embodiments, the front-side ribbon has a triangular cross-sectional shape. The rear-side ribbon may have a rectangular cross-sectional shape.

In some embodiments, the front pad may be composed of a thin copper film coated with silver.

In some embodiments, each crystalline silicon solar cell in the solar cell module additionally has a rear pad composed of a thin copper film coated with silver. In these embodiments, the crystalline silicon solar cells in the solar cell module are electrically connected in series by having the rear pad of one solar cell contact the front pad of an adjacent solar cell.

In some embodiments, each crystalline silicon solar cell in the solar cell module has a thin copper plate on its rear surface instead of rear-side ribbons. This copper plate may be coated in silver. In these embodiments, the crystalline silicon solar cells in the solar cell module are electrically connected in series by having the rear copper plate of one solar cell contact the front pad of an adjacent solar cell.

This specification also discloses method arranging crystalline silicon solar cells arranged in a shingled manner. This method comprises providing a solar cell having front and rear metallization patterns. Cutting the solar cell to form solar cell strips. Attaching front-side ribbons to the solar cell strips so that the front side ribbon contacts the front metallization patterns. Attaching rear-side ribbons to the solar cells strips so that the rear side ribbon contacts the rear metallization pattern. The rear-side ribbons being separate from the front-side ribbons and having a cross-sectional width that is 2 times larger than a cross-sectional width of the front-side ribbons. After attaching the front side ribbons and after attaching the rear side ribbons, assembling the first and second solar cell strips in a shingled manner.

In some embodiments, the method comprises providing a solar cell having front and rear metallization patterns. Attaching front-side ribbons to the solar cell so that the front side ribbon contacts the front metallization patterns. After attaching the front-side ribbons, cutting the solar cell to form solar cell strips. Attaching rear-side ribbons to the solar cells strips so that the rear side ribbon contacts the rear metallization pattern. The rear-side ribbons being separate from the front-side ribbons and having a cross-sectional width that is 2 times larger than a cross-sectional width of the front-side ribbons. After attaching the front side ribbons and after attaching the rear side ribbons, assembling the first and second solar cell strips in a shingled manner.

In some embodiments, the method comprises providing a solar cell having front and rear metallization patterns. Disposing thin film pads on the front surface and optionally on the rear surface. Attaching front-side ribbons to the solar cell so that the front side ribbon contacts the front metallization patterns. After attaching the front-side ribbons, cutting the solar cell to form solar cell strips. Attaching rear-side ribbons to the solar cells strips so that the rear side ribbon contacts the rear metallization pattern. The rear-side ribbons being separate from the front-side ribbons and having a cross-sectional width that is 2 times larger than a cross-sectional width of the front-side ribbons. After attaching the front side ribbons and after attaching the rear side ribbons, assembling the first and second solar cell strips in a shingled manner.

BRIEF DESCRIPTION OF THE DRAWINGS

The figures described below depict various aspects of the system and methods disclosed herein. Each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIGS. 3A-3B show a string of series-connected solar cells arranged in a shingled manner with long sides of adjacent solar cells overlapping to form a super cell.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners or may have non-linear edges. The term "identical" is intended to mean "identical or substantially identical" and to encompass minor deviations in shape, dimensions, structure, composition, or configuration, for example.

This specification discloses high-efficiency solar modules (also referred to herein as solar panels) comprising crystalline silicon solar cells or solar cell strips arranged in an overlapping shingled manner and electrically connected in series between adjacent overlapping solar cells to form super cells, with the super cells arranged in physically parallel rows in the solar module. The term solar cell strip refers to a solar cell formed by cutting a larger solar cell into strips. This specification will sometimes use the term solar cell to refer to solar cell strips. Shingled solar cells efficiently use the area of the solar module, reduce series resistance, and increase module efficiency. For example, in traditionally connected solar cells, an electrically conductive ribbon is used to connect the back metal busbars of a solar cell with the front metal busbars of an adjacent solar cell. This connection requires a gap between solar cells to accommodate ribbons used for connecting adjacent solar cells. With shingled solar cells, solar cells or solar cell strips are connected to each other in an overlapping manner with no gaps between cells. Without gaps between solar cells, the area within a shingled solar module is better utilized for electrical power generation, i.e. the gap area that was needed to make the front-to-back connection can now be used for electrical power generation.

A super cell may comprise any suitable number of solar cells or solar cell strips. The super cells may have lengths spanning essentially the full length or width of the solar module, for example, or two or more super cells may be arranged end-to-end in a row. Solar cells attached in a shingled manner may sometimes be referred to as a solar cell string.

In the examples described in this specification, each solar cell or solar cell strips is a crystalline silicon solar cell having front (sunny side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sunny side) surface metallization pattern may be disposed on a semiconductor layer of p-type conductivity, and the rear (shaded side) surface metallization pattern disposed on a semiconductor layer of n-type conductivity.

Figure 1:
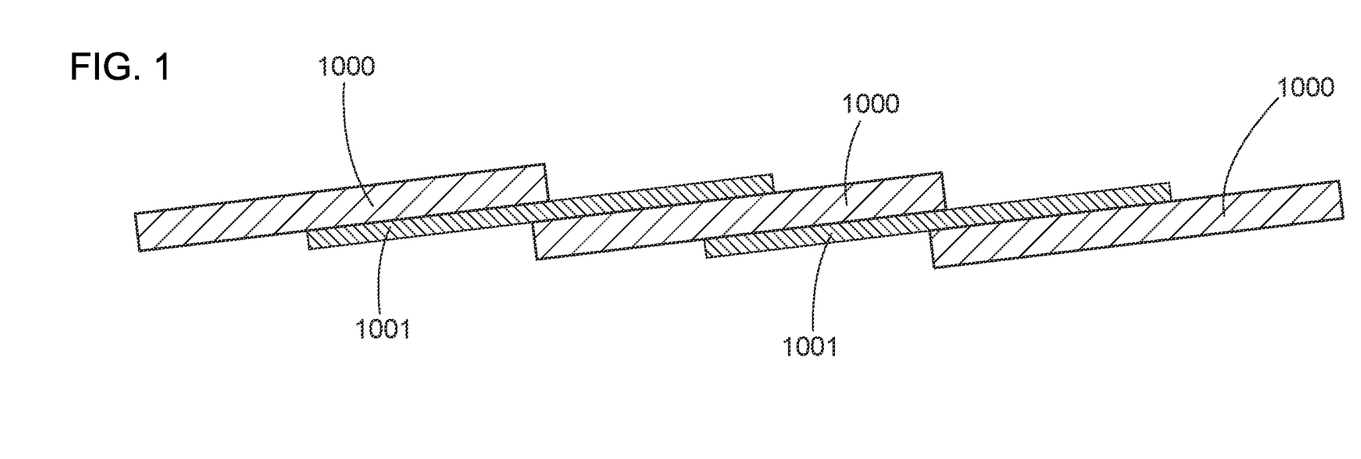
FIG. 1 shows a string of series-connected solar cells arranged in a shingled manner where adjacent cells are interconnected by a continuous ribbon.

Shingled solar cells may be electrically connected using electrically conductive adhesive (ECA) or using conductive interconnect ribbons. FIG. 1 shows a side view of a potential configuration of shingled solar cells 1000 using a ribbon interconnect 1001. The interconnect ribbon electrically connects the rear surface of one solar cell with the front surface of an adjacent solar cell. Because the interconnect ribbon is connected to the front surface of the solar cell, the cross section of the ribbon is typically circular or triangular in shape to minimize shading effects of the ribbon and to maximize the amount of light that reaches the front surface of the solar cell. But the circular or triangular shape of the ribbon creates stress on the solar cells at the overlap area because the solar cells are not pressed against a flat surface. This stress may cause the solar cells to crack due to fatigue.

Solar cells may be assembled into the shingled configuration shown in FIG. 1 by using the following exemplary process steps: 1) cutting a standard size silicon solar cell wafer into smaller (e.g. rectangular strip) solar cell cells; 2) place and solder or cure ribbons onto front surface of a leading solar cell in the solar cell string; 3) place and align another solar cell onto the leading solar cell; 4) press the solar cells together; 5) solder or cure ribbons onto rear surface of the just-added solar cell. This process from steps 2 through 4 is repeated for each additional solar cell strip to be added to the solar cell string. A difficulty with this process is that the ribbons must be attached to the solar cell string that is already arranged in a shingled manner with the surface of the solar strips inclined as shown in FIG. 1. Having the cells in an inclined position makes it difficult to solder or otherwise attach the ribbons onto the solar cell strips. The inventors have improved on this method of shingling solar cells by using a ribbon that comes in two separate parts.

Figure 2A:
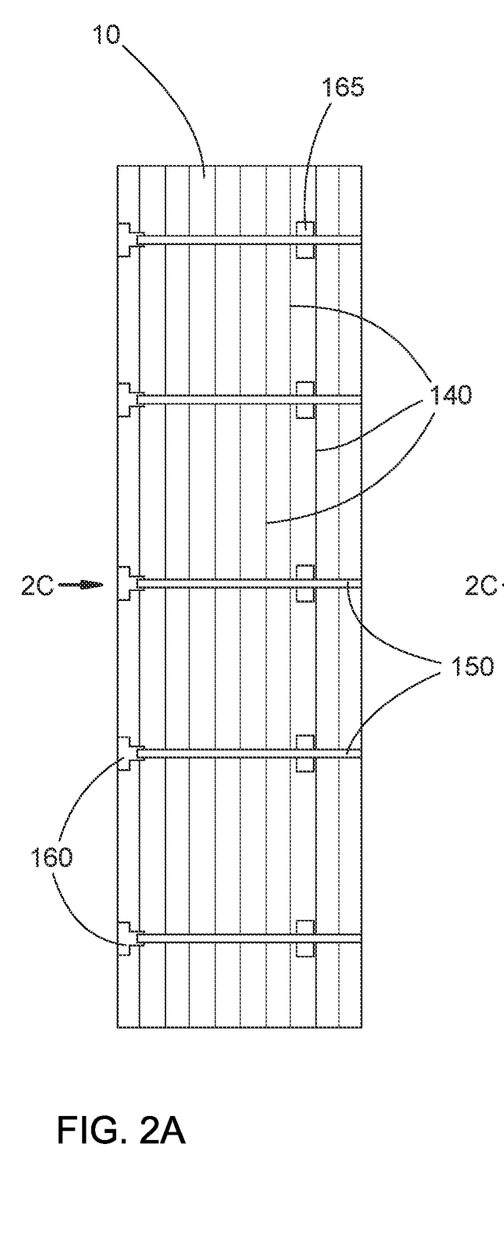
FIG. 2A shows the front-side configuration of a solar cell.
Figure 2B:
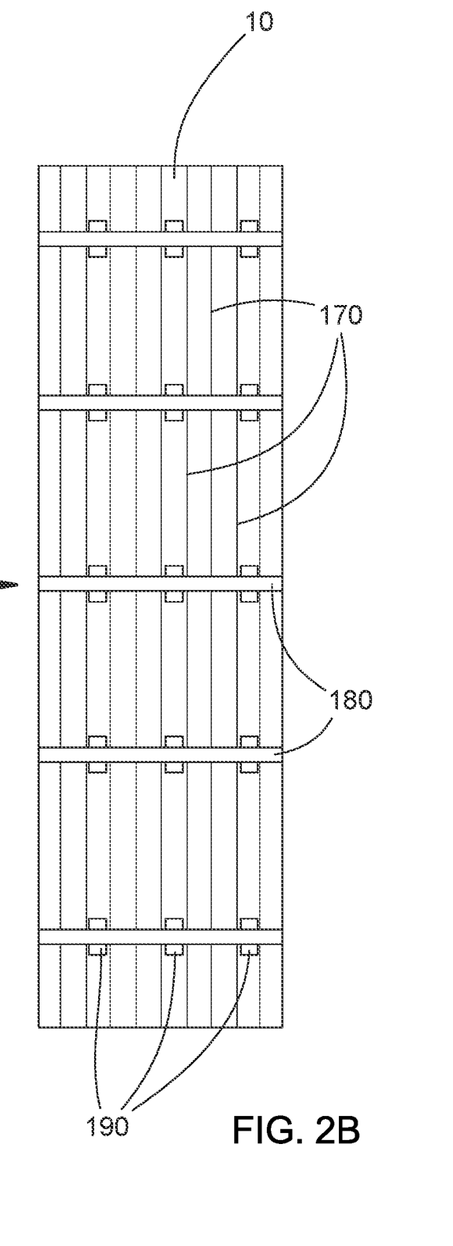
FIG. 2B shows a rear-side configuration of a solar cell.

An embodiment of a solar cell is shown in FIGS. 2A (front side) and 2B (rear side). FIG. 2A shows a front surface view, i.e. viewed from the sunny side of the solar cell, of rectangular crystalline silicon solar cell 10 having a front surface metallization pattern comprising a plurality of conductive fingers 140 which function to collect current from the front surface of the solar cell. The front surface metallization may be composed of silver. Conductive fingers 140, which are oriented parallel to the long edge of the solar cell, collect current from throughout the front surface of solar cell 10 and are electrically connected to front-side ribbons 150, which are oriented parallel to the short edge of the solar cell. The front-side ribbons 150 are disposed on top of the plurality of conductive fingers 140 and are electrically connected and disposed on top of front pads 160 located at a long edge of the solar cell. The front-side ribbons 150 are made from a conductive metal, for example, copper. The front-side ribbon may contact one or more contact pads 165 located along the length of the ribbon. In some embodiments, a bus bar (not shown) may run along substantially the entire length of the ribbon underneath ribbon 150. As shown in FIG. 2A, the front-side ribbons run substantially along the entire short length of the front surface, but do not extend to the long edge of the solar cell where front pads 160 are located. Front-side ribbons 150 are very thin and have a substantially circular or triangular cross-sectional area to minimize the effect of shading the ribbon has on the front surface of the solar cell while still maintaining adequate conductance. For example, front-side ribbon has a circular shape with a diameter of about 0.2 mm or a triangular shape with a base width of about 0.2 mm.

Front pad 160 may have two portions. A first portion runs along the long edge of the solar cell and designed to make contact with a rear-side ribbon as discussed below. The first portion may have a length of a range of 1~5 mm (typical 2.5 mm), which runs along the edge of the solar cell. A second portion extend towards the interior of the front surface. The second portion is designed to make contact with the front-side ribbon 150. The second portion may extend 0.1 mm~1 mm (typical 0.5 mm) from the edge of the solar cell into the interior of the front surface. Each front pad is paired with a front-side ribbon so that each front-side ribbon will have one and only one front pad. Front pad 160 may have the same composition as contact pad 165, i.e. both are silver.

Figures 12A, 12B:
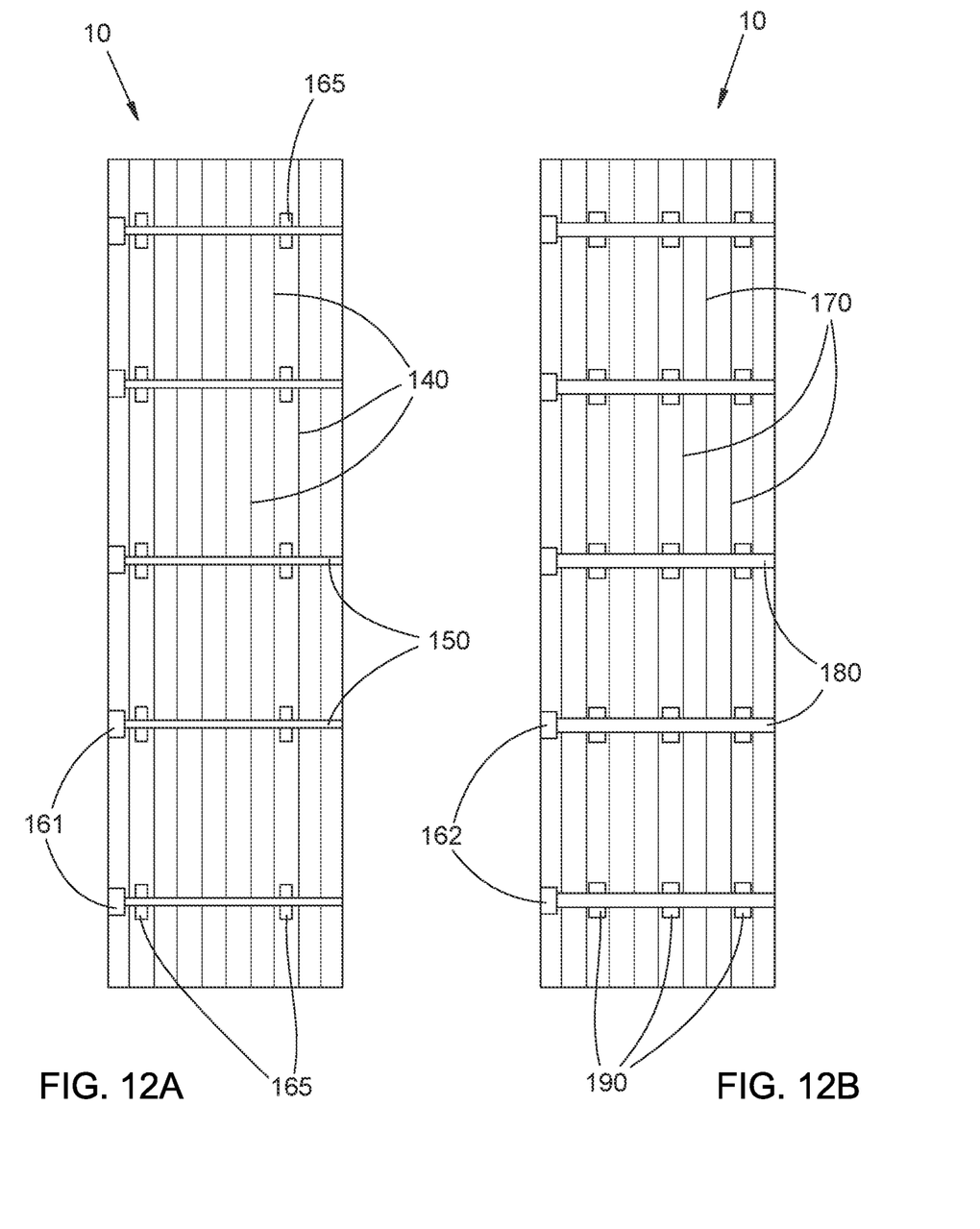
FIG. 12A shows a front-side configuration a solar cell.
FIG. 12B shows a rear side configuration of a solar cell.

An alternative configuration of the front side of a solar cell is shown in FIG. 12A. An alternative configuration of the rear side of a solar cell is shown in FIG. 12B. A solar cell may be configured to have a front side as shown in FIG. 12A and a rear side configured as shown in FIG. 2B. A solar cell may also be configured to have a front side as shown in FIG. 12A and a rear side configured as shown in FIG. 12B. In FIG. 12A, the solar cell has a front thin film pad 161 made of a thin copper film coated with silver instead of front pad 160. The thin copper film may be 10 μm to 100 μm thick and the silver coating may be 50 to 500 nanometers thick. Front thin film pad 161 runs along the long edge of the solar cell and is designed to make contact with a rear-side ribbon as discussed below. The front-side ribbon 150 makes electrical contact with the front thin film pad 161. There are several advantages to using a thin copper film pad instead of a silver front pad. One is cost advantage. Silver is more expensive than copper and a thin copper film pad uses less silver than a front pad made entirely from silver. Another advantage is that copper has less electrical resistance than silver and therefore the thin copper film pad makes for a better electrical conductor than a silver front pad. A further advantage is that thin copper film pads can be used with standard MBB (Multi-busbar) solar cells. Standard MBB solar cell are commercially available from various manufacturers. But standard MBB solar cells do not have front pads 160 as shown in FIG. 2A. To add silver front pads to a MBB solar cell requires the manufacturer of the solar cell to customize the solar cell by adding silver front pads to the solar cell. This customization costs extra and reduces the availability of the solar cells as compared to standard solar cells. In addition, adding silver front pads to a solar cell is a high temperature process that can only be effectively done by the solar cell manufacturer. In contrast, adding thin copper film pads to a solar cell can be done by soldering, which is a relatively low temperature process can be done by the solar module maker. This advantage is significant as it allows the person or entity assembling the solar cells into a solar module to use standard MBB solar cells rather than customized MBB solar cells.

FIG. 2B shows a rear surface view, i.e. viewed from the shade side of the solar cell, of rectangular crystalline silicon solar cell 10 having a rear surface metallization pattern comprising a plurality of conductive fingers 170 oriented parallel to the long edge of the rectangular solar cell which function to collect current from the rear surface of the solar cell. The rear surface metallization may be composed of silver. Conductive fingers 170 collect current from throughout the rear surface of solar cell 10. Conductive fingers 170 are electrically connected to rear-side ribbon 180. Rear-side ribbon 180 generally has a rectangular cross-sectional area and is significantly wider and flatter than front-side ribbon 150. The rear-side ribbon is made from a conductive metal, for example, copper. The rear-side ribbon may also have a conductive metal core, e.g. of copper, coated in silver, lead, tin, lead-tin, or tin-bismuth. The coating may be done by electroplating.

The rear surface metallization may also comprise conductive pads 190, e.g. silver pads, that serve as attachment points for the rear-side ribbon. In one embodiment, the rear-side ribbons are attached to the rear surface conductive pads of the solar cell by use of solder paste. In a preferred embodiment, the conductive pads, e.g. attachment points, are in the interior of the rear surface of the cell and not at the edge of the cell. This is in contrast to front pads 160 that are located at the edge of the front surface. The rear surface may include a rear thin film pad 162 as shown in FIG. 12B. The rear thin film pad 162 may be a thin copper film coated with silver. The thin copper film may be 10 μm to 100 μm thick and the silver coating may be 50 to 500 nanometers thick. Rear thin film pad 162 runs along the long edge of the solar cell and is designed to make contact with the front pad of an adjacent solar cell as discussed below. The rear-side ribbon 180 makes electrical contact with rear thin film pad 162.

Figure 2C:
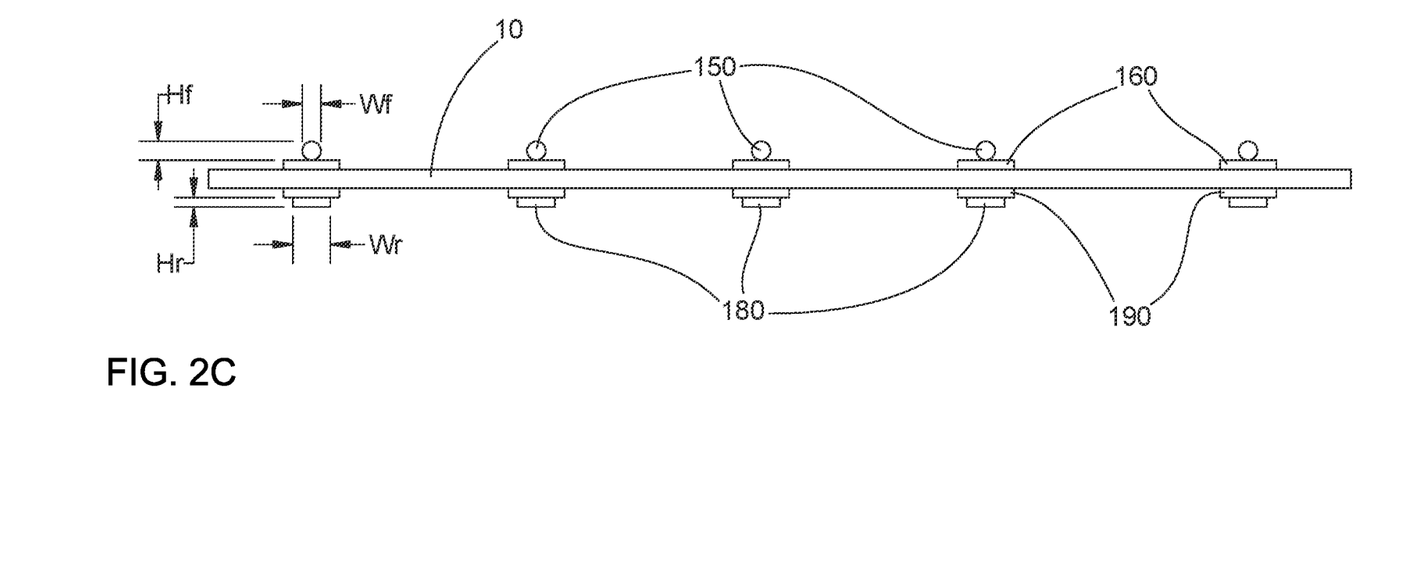
FIG. 2C shows a side view of the solar cell in FIGS. 2A and 2B viewed from arrow A.

FIG. 2C shows an edge view of solar cell 10 as viewed from arrow 2C in FIG. 2A or 2B. The edge view of the solar cell shows that the cross-sectional shapes of the front-side ribbon and the rear-side ribbon are different. The front-side ribbon 150 has a circular cross-sectional shape. Other cross-sectional shapes are possible such as a triangular cross-sectional shape. The cross-sectional width (labeled Wf in FIG. 2C) of front-side ribbon 150 is relatively small. For example, Wf may be typically 0.2 mm. Generally, Wf may range from 0.1 mm to 0.3 mm. The front-side ribbon also has a cross-sectional height, Hf, that may range from 0.1 mm to 0.3 mm. The cross-sectional width of the front-side ribbon must be relatively small so as not to block sunlight from reaching the front surface of the solar cell. The cross-sectional width of the front-side ribbon remains substantially constant throughout the length of the ribbon. If the front-side ribbon has a circular cross-sectional area, then Wf is the diameter of the circle. If the front-side ribbon has a triangular cross-sectional area, then Wf will be the length of the base of the triangle.

Rear-side ribbon 180 has a substantially rectangular cross-sectional shape in FIG. 2C, although other cross-sectional shapes may be used. The rear-side ribbon has a cross-sectional width labeled Wr in FIG. 2C. The rear-side ribbon cross-sectional width Wr is significantly greater than the front-side ribbon cross-sectional width Wf. The cross-sectional width, Wr, may vary be from 0.5 mm to 3 mm. As shown in FIG. 2C, rear-side ribbon 180 also has a cross-sectional height, Hr, which may vary from 20 microns to 200 microns. While the width and height of the rear-side ribbon may vary between these stated ranges, a minimum cross-sectional area of the ribbon must be maintained so that the conductance of the ribbon remains above a certain level. For example, the rear-side ribbon may have a width Wr of 3 mm and a height Hr of 20 microns. In another example, the rear-side ribbon may have a width Wr of 0.5 mm and a height Hr of 200 microns. The cross-sectional width of the rear-side ribbon remains substantially constant throughout the length of the ribbon. In some embodiments, the cross-sectional area of the rear-side ribbon is substantially the same as the cross-sectional area of the front-side ribbon.

While the front-side ribbon width, Wf, should be relatively small, the rear-side ribbon should be relatively wide and flat. Generally, the cross-sectional width of the rear-side ribbon, Wr, should be at least 2 times greater than the cross-sectional width of the front-side ribbon, Wf. In another exemplary embodiment, Wr is 3 times greater than Wf.

Figure 3A:
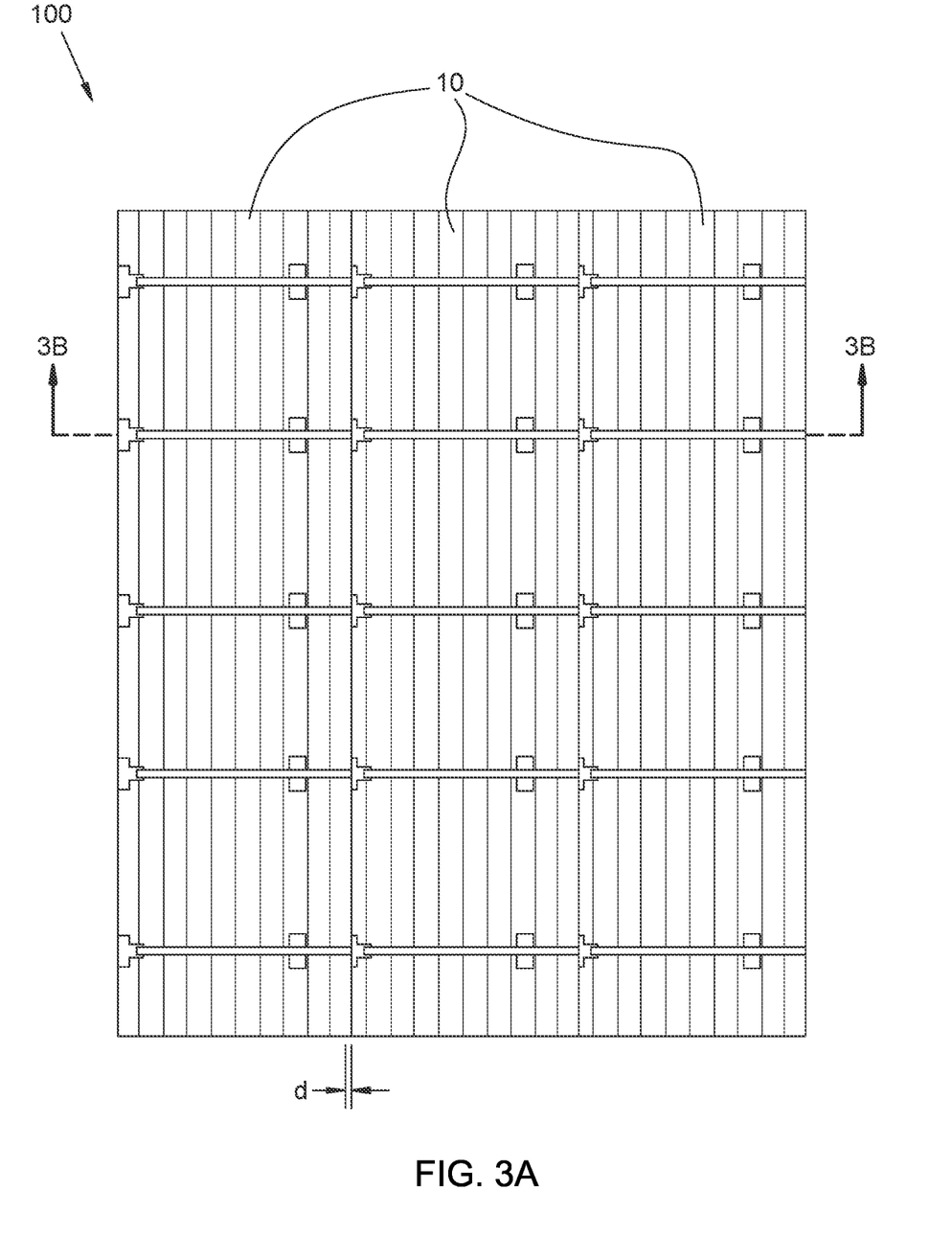
FIG. 3A shows a front surface view of the string of solar cells.

FIG. 3A shows multiple solar cells 10 with configurations shown in FIGS. 2A and 2B may be connected together in a shingled manner with the long ends of adjacent solar cells overlapping and electrically connected in series to form super cell 100. Each solar cell 10 comprises a semiconductor diode structure and electrical contacts to the semiconductor diode structure by which electric current generated in solar cell when it is illuminated by light may be provided to an external load. FIG. 3A shows a front surface view of the front (sunny side) surface, e.g. FIG. 2A, of a string of series-connected solar cells 10 arranged in a shingled manner. This string of series connected solar cells forms super cell 100. Other solar cells discussed in this application, e.g. solar cells with configurations shown in FIGS. 12A and 12B, may be shingled together in a similar manner.

Figure 3B:
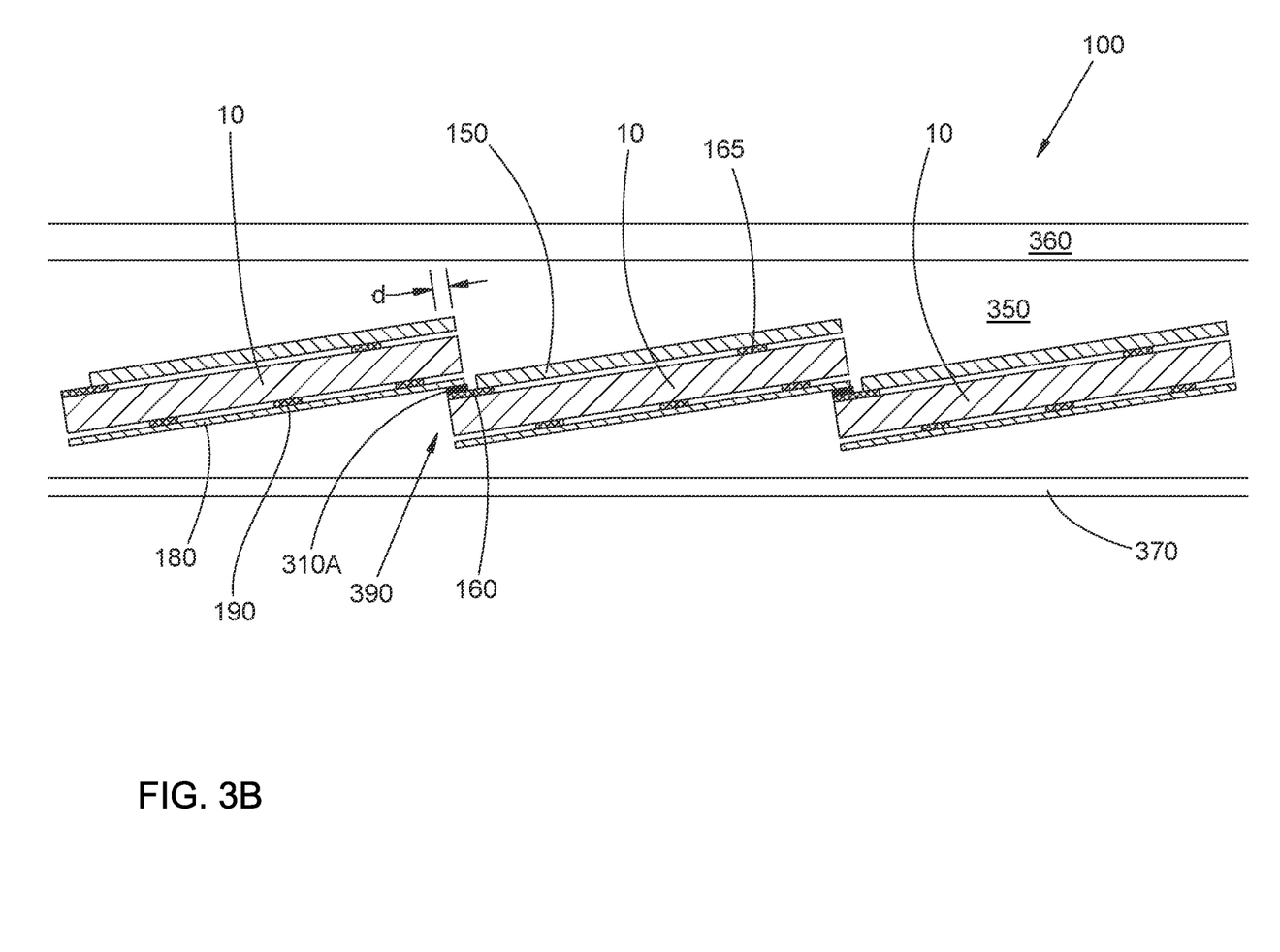
FIG. 3B shows a cross-sectional view of the string of solar cells taken from line 3B-3B in FIG. 3A.

FIG. 3B shows a cross-sectional view of the string of series-connected solar cells 10 through line 3B-3B in FIG. 3A. The solar cells in FIG. 3B have a front side configuration as shown in FIG. 2A and a rear side configuration as shown in FIG. 2B. The solar cells are connected to adjacent solar cells in a shingled manner. Each solar cell 10 has front-side ribbon 150 with a circular or triangular cross-section attached to the front surface of the solar cells. Each solar cell 10 also has a rear-side ribbon 180 attached to the rear surface conductive pads 190 of the cell. The cells 10 also have conductive fingers on the front and rear surfaces, not shown in FIG. 3B. The leftmost cell is electrically connected to adjacent middle cell via ribbon 180 through solder paste 310A and front pad 160 of the middle cell. The middle cell is electrically connected to the rightmost cell in a similar manner. Comparing FIG. 3B to FIG. 1 shows that the arrangement in FIG. 3B splits a typical interconnect ribbon connecting the rear side of one solar cell to the front side of an adjacent solar cell into two portions: a rear-side ribbon 180 and a front-side ribbon 150.

An advantage of the shingled configuration depicted in FIG. 3B is that the flat rear-side ribbon is sandwiched between two adjacent solar cells in the overlap area whereas in the typical configuration shown in FIG. 1 the front-side ribbon, which has a circular or triangular cross-sectional area, is sandwiched between two adjacent cells in the overlap area. The circular or triangular shape of the ribbon in FIG. 1 as well as the height of the front-side ribbon creates stress on the solar cells at the overlap area and may cause the solar cells to crack due to fatigue. Having the flat thin rear-side ribbon sandwiched between two adjacent cells, as depicted in FIG. 3B, eliminates this type of stress on the solar cells.

Another advantage of the shingled configuration depicted in FIG. 3B over shingled cells connected by ECA is that the overlap area 390 between adjacent solar cells can be much smaller. In one embodiment, the overlap distance, d, (shown in FIGS. 3A & 3B) between two solar cells may be 0.5 mm. In another embodiment, the overlap distance may be 0.2 mm. The overlap distance preferably is between 0 mm and 0.8 mm. Minimizing the overlap distance is advantageous because less overlap area results in a greater area of the face surface of the solar cell being exposed to sunlight and contributing to generating electricity. In contrast, shingled cells electrically connected by ECA must have a minimum overlap distance of at least about 1 mm for the ECA to properly function as an adhesive.

A further advantage of the shingled configuration depicted in FIG. 3B is the flexibility created at overlap area 390 by not having solder paste on both sides of the rear-side ribbon at the overlap area. As shown in FIG. 3B, solder paste 310A attaches the rear-side ribbon of the left solar cell to front pad 160 of the middle solar cell. But there is no solder paste attaching the rear-side ribbon to the left solar cell at overlap area 390. Since the rear-side ribbon is relatively soft and flexible, this allows the solar cells to flex slightly relative to each other and creates less stress at the overlap area. If solder paste were present at the overlap area attaching the rear-side ribbon to the left solar cell, then the overlap area would be mechanically fixed at the overlap area, not allowing the solar cells to flex relative to each other and possibly cracking the solar cells due to mechanical fatigue.

Solar modules described in this specification may comprise a laminate structure as shown in FIG. 3B with super cells and one or more encapsulant materials 350 sandwiched between a transparent front sheet 360 and a back sheet 370. The transparent front sheet may be glass, for example. The back sheet may also be glass, or any other suitable material. The encapsulant material may be ethylene-vinyl acetate (EVA).

Figure 4:
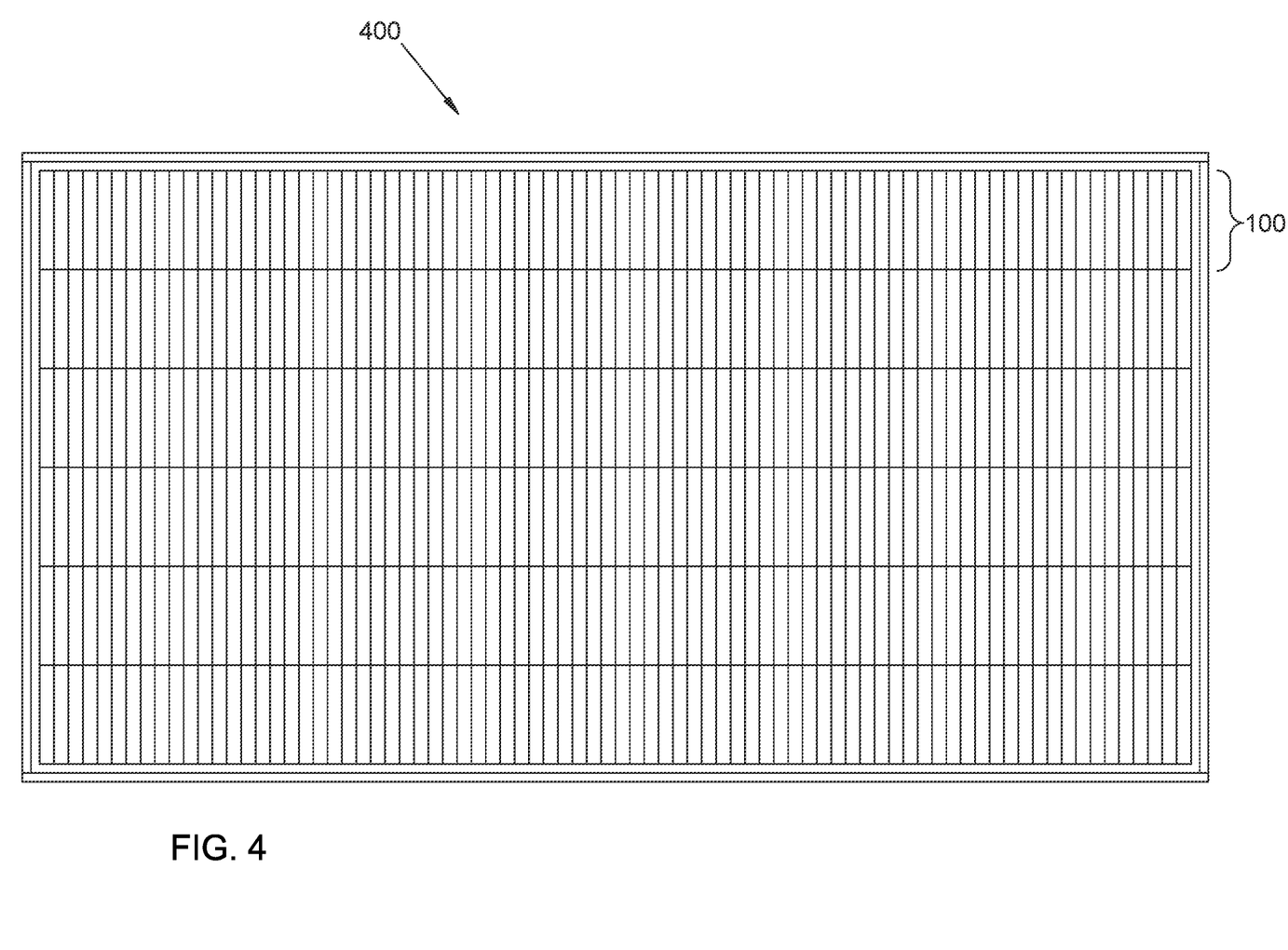
FIG. 4 shows the front surface of an example solar module comprising a plurality of shingled super cells, with the long side of each super cell having a length of approximately the full length of the long side of the module. The super cells are arranged with their long sides parallel to the long sides of the module.

FIG. 4 shows a front surface view of an example rectangular solar module 400 comprising six super cells 100, each supercell containing approximately eighty solar cells 10. Each super cell 100 may contain any number of solar cells, preferably between 50 and 100 solar cells. Each super cell 100 has a length approximately equal to the length of the long sides of the solar module. In this example super cells 100 are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have short sides having a length, for example, of about 1 meter and long sides having a length, for example, of about 1.5 to about 2.0 meters. Any other suitable shapes (e.g., square) and dimensions for the solar modules may also be used. Super cell 100 may comprise any suitable number of rectangular solar cells 10 of any suitable dimensions. Similarly, a row of super cells may comprise any suitable number of rectangular solar cells of any suitable dimensions arranged in one or more super cells.

Figure 5A:
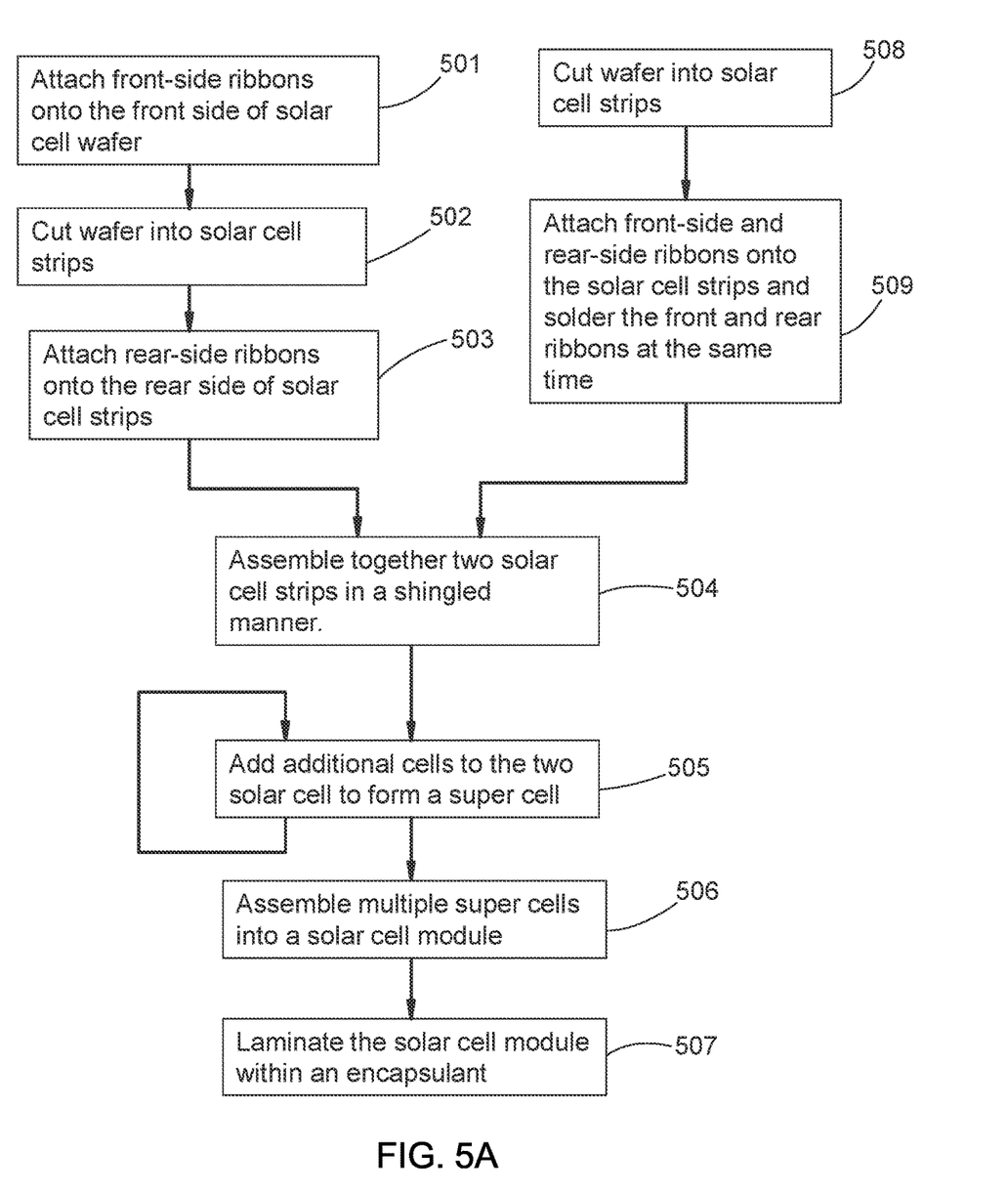
FIGS. 5A and 5B depict example methods of assembling solar cells together in a shingled manner to form a solar cell module.

FIG. 5A is a block diagram showing steps for assembling solar cells into a solar cell module. The starting material for the process of FIG. 5A is a solar cell wafer with conductive fingers 140 and front pad 160 placed on the front surface of the solar cell wafer and conductive fingers 170 placed on the rear surface of the solar cell wafer by the solar cell manufacturer. In step 501, the front-side ribbons are attached to the front surface of a solar cell wafer. The front-side ribbons may be attached to the solar cell wafer by various methods known in the art. In step 502, the wafer is cut into individual solar cells (e.g. into rectangular solar cell strips). In step 503, the rear-side ribbons are attached to the rear-side of each individual solar cell. The front-side and rear-side ribbons can be attached to the solar cells by various methods. An exemplary method is to place solder paste onto the conductive pads on the surface of the solar cell, then placing or pressing the ribbon into the solder paste, and finally soldering or curing the solder paste. As discussed, the points of attachment for the rear-side ribbons are located on the interior of the rear surface as shown in FIG. 2B. In another exemplary method, solder flux alone may be use if the rear-side ribbon has a lead-tin alloy coating.

An alternative method of assembling solar cells into a solar module shown in FIG. 5A is instead of steps 501-503, the solar cell wafer is first cut into solar cell strips in step 508. In step 509, the front-side and rear-side ribbons are attached to the solar cell strips. If solder is used to attach the ribbons, the solder for the front-side and rear-side ribbons may be cured at the same time, e.g. in an oven. This has the advantage of subjecting the solar cell to one less curing process step. Fewer curing steps has the advantage of producing less stress on the silicon in the solar cells.

Figure 5B:
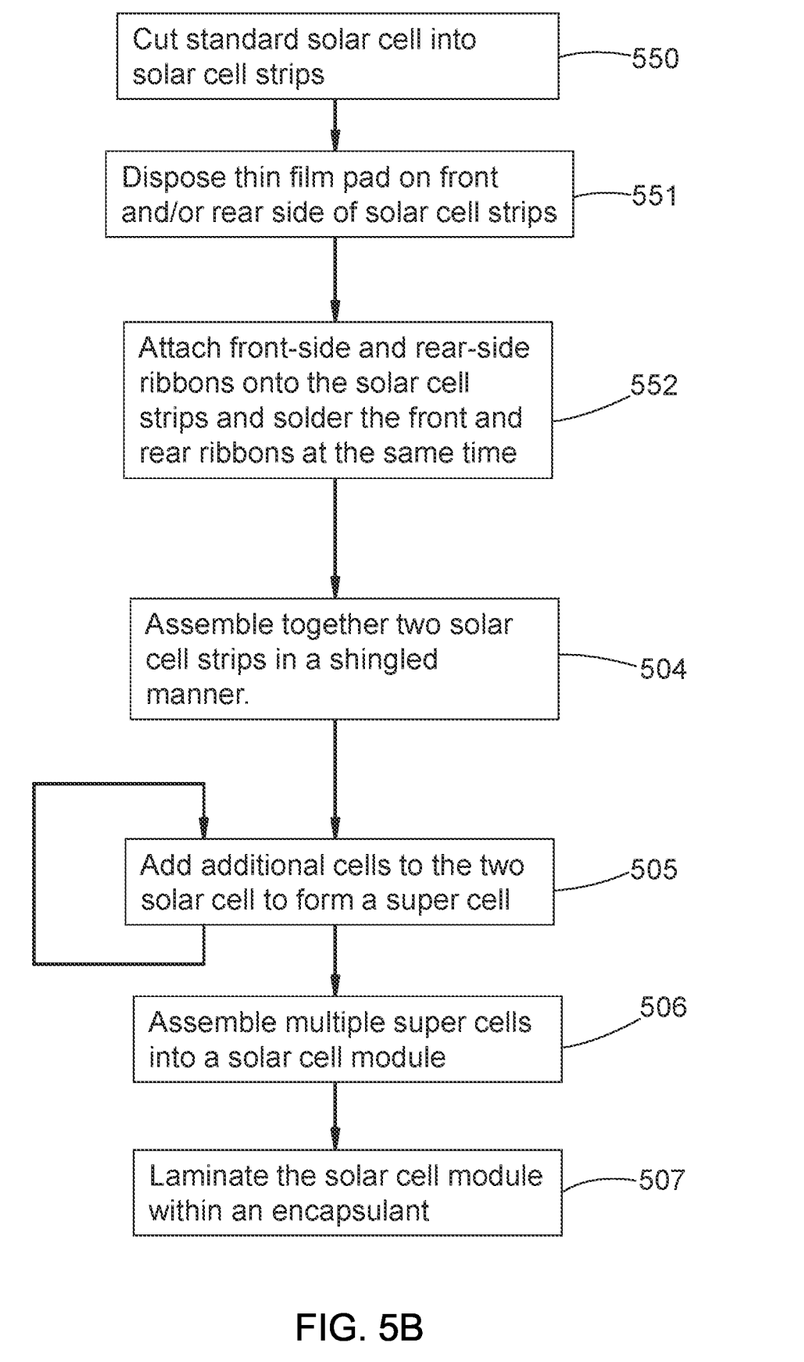

FIG. 5B is block diagram showing steps for assembling solar cells with thin copper film pads into solar modules. The starting material for the process of FIG. 5B is a standard solar cell, i.e. a standard solar cell commercially available from a solar cell manufacturer without customization. In step 550, the standard solar cell is cut into solar cell strips. In step 551, a front thin film pad is disposed on the front side of the solar cell and optionally a rear thin film pad is disposed on the rear side of the solar cell. The thin film pads may be attached to the solar cell by soldering. In step 552, front-side and rear-side ribbons are attached to the solar cell strips with the front-side ribbon making electrical contact with the front thin film pad and the rear-side ribbon making electrical contact with the rear thin film pad, if one exists. If solder is used to attach the ribbons, the solder may be cured at the same time.

After ribbons are placed on the solar cell strips, the process of assembling the strips is the same for FIGS. 5A & 5B. In step 504, two solar cells are assembled in a shingled manner. The manner in which two solar cell strips are shingled vary. In one embodiment, solder paste 310A is placed on the ends of rear-side ribbons 180. Alternatively, solder paste 310A is placed on front pad 160. Then, the solar cells are shingled so that solder paste 310A contacts front pad 160 of the adjacent solar cell as shown in FIG. 3B. If the solder paste was first placed on front pad 160, then the cells are shingled so that solder paste 310A contacts the rear-side ribbons of an adjacent cell. After shingling the cells together, solder paste 310A may be soldered or cured. Further alternative methods of shingling the solar cell strips are discussed below. In step 505, additional solar cells are added to the two solar cells in a shingled manner. Step 505 is repeated adding additional solar cell until a complete super cell is formed. For example, step 505 may be repeated 78 times to make a super cell containing 80 solar cells all arranged in a shingled manner.

This method of shingling solar cells with a two-part ribbon is superior to the typical method of assembling shingled solar cells. One advantage is that only in the last steps of the shingling process, e.g. steps 504 & 505, are the cells in an inclined shingled position. This allows the steps of attaching ribbons to the front and rear surfaces of the cell to be performed on a level surface. In contrast, the process of shingling the solar cells of FIG. 1 requires repeatedly attaching ribbons to cells in an inclined position during the shingling process.

To form a solar module, in step 506, multiple super cells are assembled electrically connected in parallel. For example, the solar module in FIG. 4 is formed by electrically connecting 6 super cells in parallel. After assembling the super cells, the solar module is laminated as step 507. The most common way to laminate a solar module is by using a lamination machine. The solar cells are placed between two layers of encapsulant materials, such as EVA. Other layers may be added such as a transparent front sheet 360 and a back sheet 370. The layers are placed in the lamination machine. The lamination process involves pumping air out of the module layers in a vacuum chamber, heating the layers to melt the encapsulant, and pressing the layers together to embed the solar cells in the encapsulant and adhere the front and back sheets.

These process steps illustrate another advantage in using two separate ribbons, e.g. a front-side ribbon and a rear-side ribbon, is that the area of the conductive pads used on the rear surface of the solar cell may be substantially smaller when compared with typical ribbon connected shingled solar cells. This is because the rear-side ribbons are attached separately from the front-side ribbon. Further, the rear-side ribbons are not attached while in an inclined position. Both these factors allow for greater accuracy in the placement of the rear-side ribbons than is possible with typical assembly methods. In the typical assembly method, the interconnect ribbon is first placed on the front surface of a solar cell, which is already part of a shingled string of cells and already in an inclined position. Then, a solar cell to be added to the string must be aligned with the ribbons already in place. This alignment of all ribbons at once is not precise and therefore a conductive pad with a larger area is needed to ensure that the ribbons are placed on the conductive pad and in the solder paste. In contrast, in the process of FIG. 5, the rear-side ribbons to individual solar cells in flat position before the shingling steps. This ensures greater accuracy of placement can be achieved. Whereas typical rear conductive pads for ribbon attachment is 2 mm×4 mm in size, the conductive pads 190 may be 1 mm×3 mm in size which is at least a 50% reduction in silver usage, if the silver pads are used, as compared to typical ribbon connected shingled solar cells. Conductive pads 190 may range in size from 1 to 8 mm$^2$.

Figure 6A:
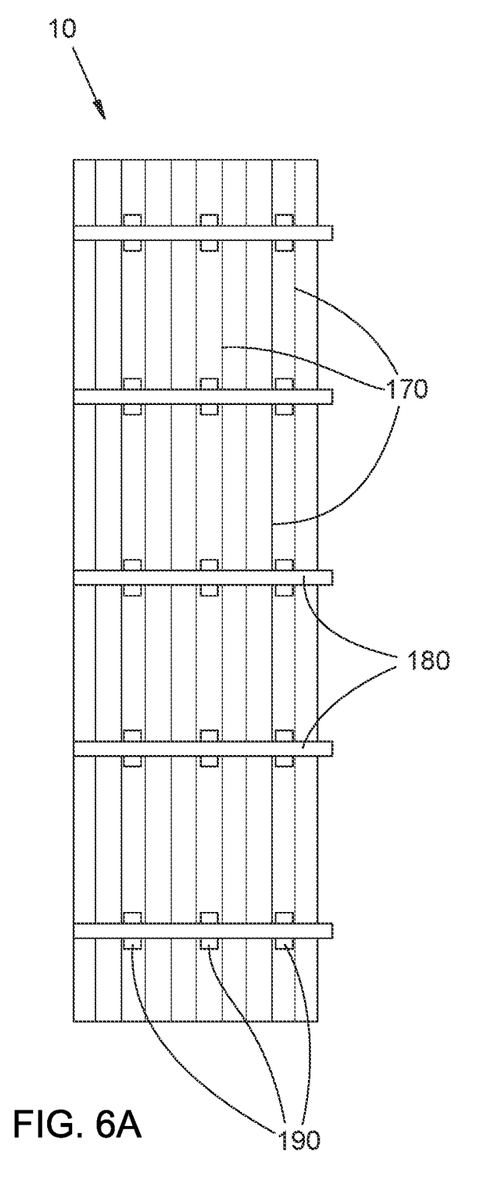
FIG. 6A shows the rear-side configuration of a solar cell.
Figure 6B:
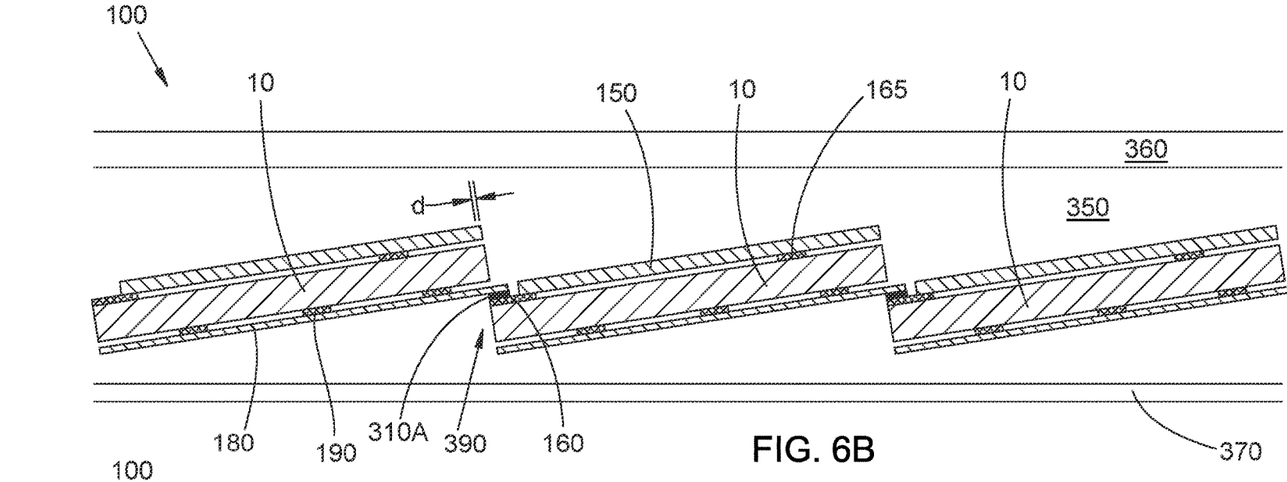
FIG. 6B shows a cross-sectional view of the string of solar cells with rear side configuration of FIG. 6A arranged in a shingled manner.

FIG. 6A shows a rear surface view, i.e. viewed from the shade side of the solar cell, of an alternate configuration of solar cell 10 where the rear-side ribbon 180 extends past the edge of the solar cell. The front side configuration of the cell may be, e.g., as shown in FIG. 2A. In FIG. 6A, rear-side ribbons 180 extends past the right edge of the solar cell. FIG. 6B shows the solar cells of FIG. 6A arranged in a shingled manner. The advantage of having the rear-side ribbon extend past the edge of the solar cell is that the overlap distance d between two adjacent solar cells is further minimized as shown in FIG. 6B. The portion of the rear-side ribbon that extends past the edge of the solar cell is soldered to the front pad of the adjacent cell. Decreasing the overlap distance d will allow more sunlight to reach the front surface of the solar cells. Using the configuration of FIG. 6B, the overlap distance can be close to zero. For example, the overlap distance may be 0.1 mm or less but greater than zero or may be 0.07 mm or less but greater than zero. For example, the overlap distance may be 0.05 mm.

Figure 7:
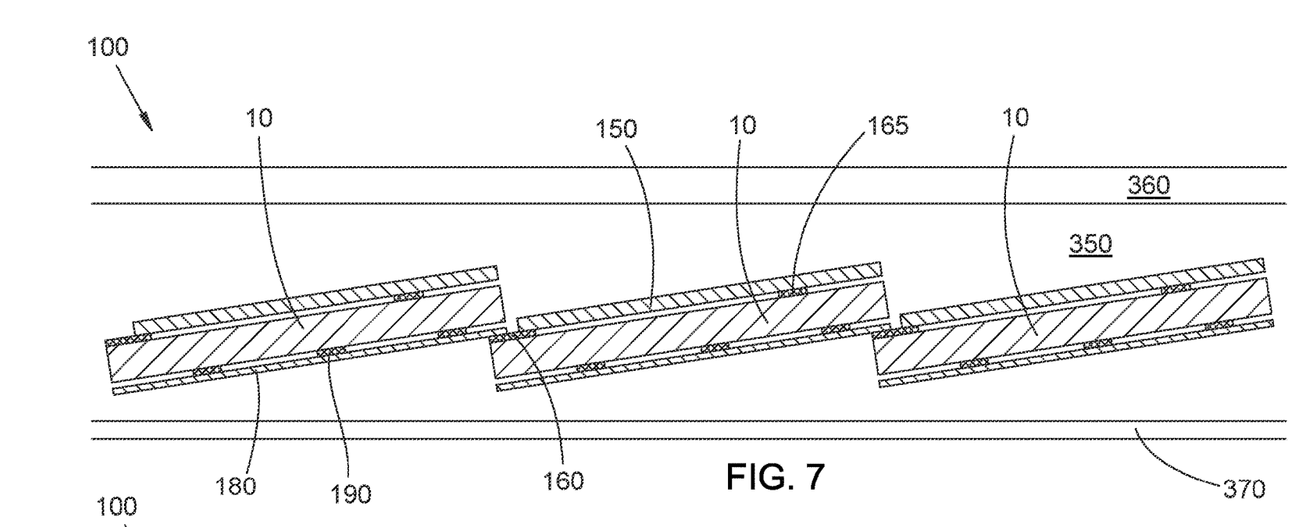
FIG. 7 shows a cross-sectional view of the string of solar cells arranged in a shingled manner.

FIG. 7 shows an alternate embodiment of shingled solar cells. The solar cells may have configurations as shown in FIGS. 2A and 2B. In FIG. 7, the rear-side ribbon 180 is in contact with front pad 160 of an adjacent solar cell. Contact with front pad 160 is made without the use of adhesive or solder or other materials to bond the rear-side ribbon to the front pad. The inventors have surprisingly discovered that with the solar cells arranged as illustrated in FIG. 7, the lamination process where the solar cells are pressed against each other and pressed into and sealed in encapsulant is enough to keep rear-side ribbon 180 in contact with the front pad of an adjacent solar cell without further use of adhesive, solder, or other bonding agent. Without the solar cells the laminate structure, the solar cells can be detached from one other. Further, use of a silver front pad and a silver coated rear-side ribbon, e.g. a silver coated copper ribbon, makes the electrical contact more reliable. In this embodiment, the soldering step is removed during assembly of the shingled solar cells further simplifying the process steps needed to make a solar module.

Another alternative to making the contact between rear-side ribbon of one solar cell and the front pad of an adjacent solar cell is to use a low-temperature solder coating on the rear-side ribbon. For example, rear-side ribbon 180 may be composed copper coated with tin-bismuth. Use of a low-temperature solder coating allows the solder coating to re-flow and solder during the lamination process. This has the advantage of simplifying the assembling process by eliminating many individual solder steps. With the use of low-temperature solder coated rear-side ribbons, all the soldering of rear-side ribbons to fronts pads occurs in one step during the lamination of the solar module. In addition to tin-bismuth, other types of low-temperature solders may be used as a coating. To be effective, the low-temperature solder must have a re-flow temperature below the temperature achieved during lamination of the solar module. For example, the reflow temperature of the low-temperature solder coating may be below 150 degrees C. The low-temperature solder coating may be coated onto the ribbon by electroplating.

Figure 8:
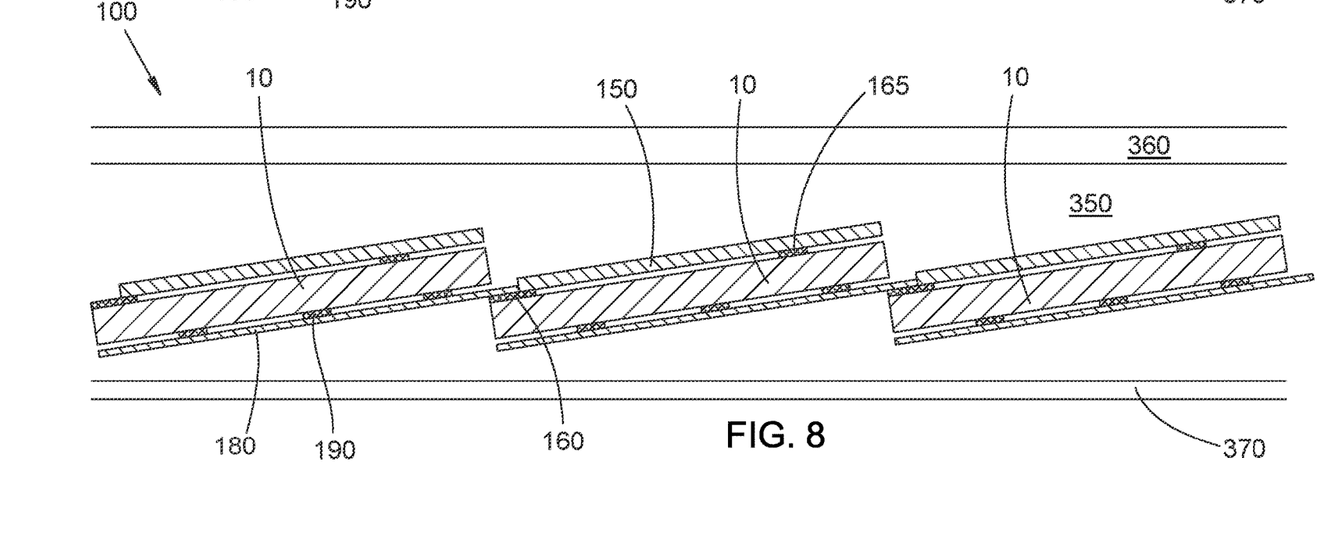
FIG. 8 shows a cross-sectional view of the string of solar cells arranged in a shingled manner.

FIG. 8 shows an alternate embodiment of shingled solar cells. The solar cells in the FIG. 8 have a rear side configuration as shown in FIG. 6A, i.e. they have rear-side ribbons that extend past the edge of the solar cell. The solar cells may have a front-side configuration as shown in FIG. 2A. In FIG. 8, the rear-side ribbon 180 contacts and is directly soldered to the front-side ribbon 150 of an adjacent solar cell when shingling the solar cells. That is, there is no gap between rear-side ribbon 180 and front-side ribbon 150.

Figure 9A:
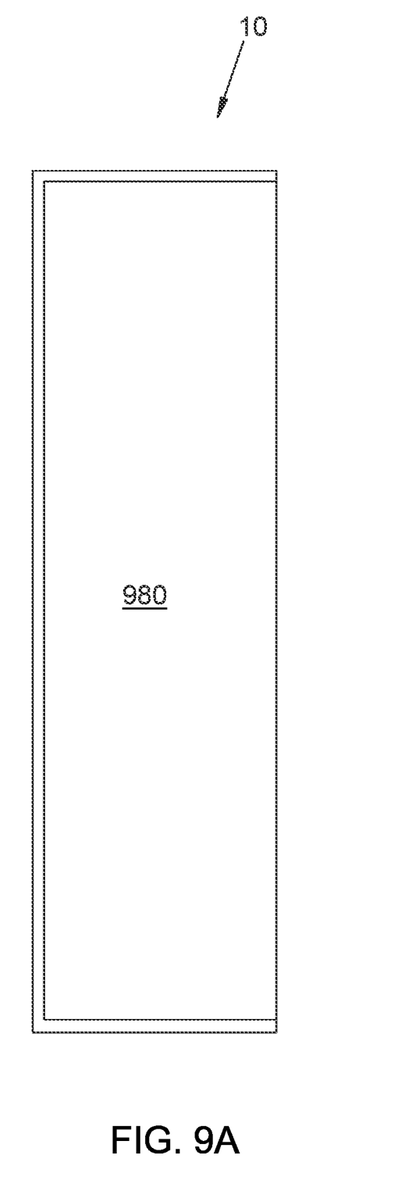
FIG. 9A shows the rear-side configuration of a solar cell.

FIG. 9A shows an alternate rear side configuration of a solar cell. In FIG. 9A, instead of copper ribbons, almost the entire rear surface of the solar cell is covered with a thin copper plate 980. Copper plate 980 may be soldered unto the rear surface of the solar cell and may be coated with silver or silver alloy. The copper plate 980 is thin having a thickness of between 10 microns to 100 microns. Copper plate 980 covers almost the entire rear surface of the solar cell and extends almost to the edges on three sides of the solar cell. On the side where the solar cells will overlap with an adjacent cell, copper plate 980 does extend all the way to the edge of the solar cell, as shown in FIG. 9A. The advantage of using a copper plate is less silver is needed for the rear surface metallization. For example, the density of conductive fingers 170 used on the rear surface of the cell may be less than would normally be required. For example, the conductive fingers 170 may instead be conductive points electrically connecting the semiconductor layers of the solar cell to the copper plate. In addition, if the solar cell is a thin wafer solar cell, a silver coated copper plate can reflect light that reaches the rear surface of the solar cell back into the solar cell thereby increasing the efficiency of solar cell.

Figure 9B:
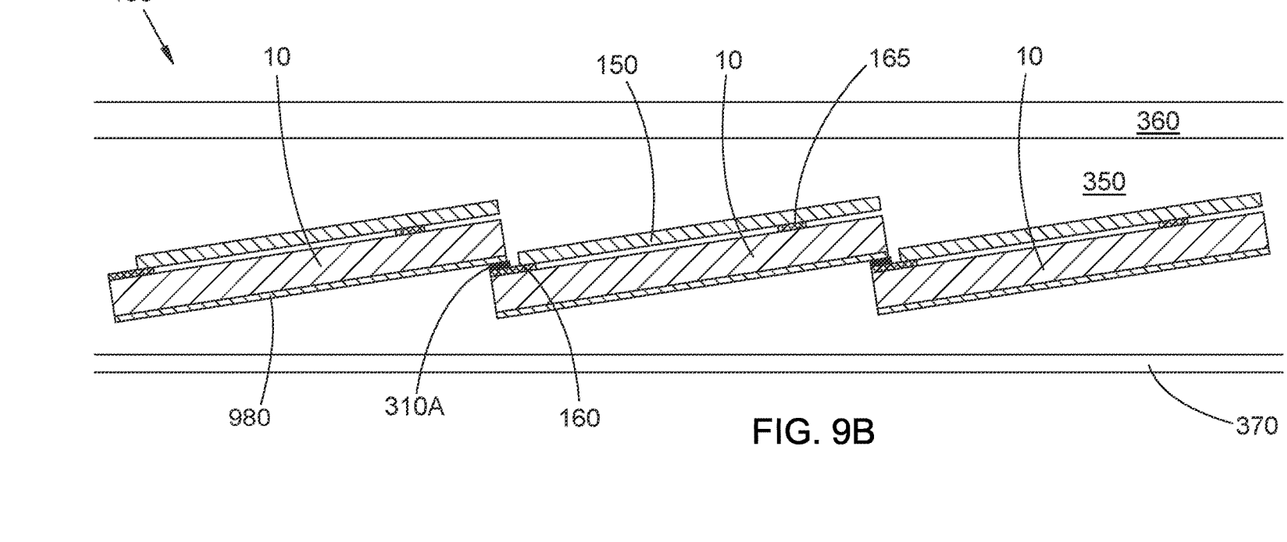
FIG. 9B shows a cross-sectional view of the string of solar cells with rear side configuration of FIG. 9A arranged in a shingled manner.

FIG. 9B shows the solar cells with rear side configurations of FIG. 9A arranged in a shingled manner. The copper plate 980 may be soldered unto the front pads 160 of the adjacent solar cell as shown in FIG. 9B. Alternatively, simple contact with the front pad may be sufficient without the use of solder or adhesive. As with the embodiment of FIG. 7, the lamination process is enough to keep copper plate 980 in contact with the front pads 160 of an adjacent solar cell without further use of adhesive or solder.

Figure 10:
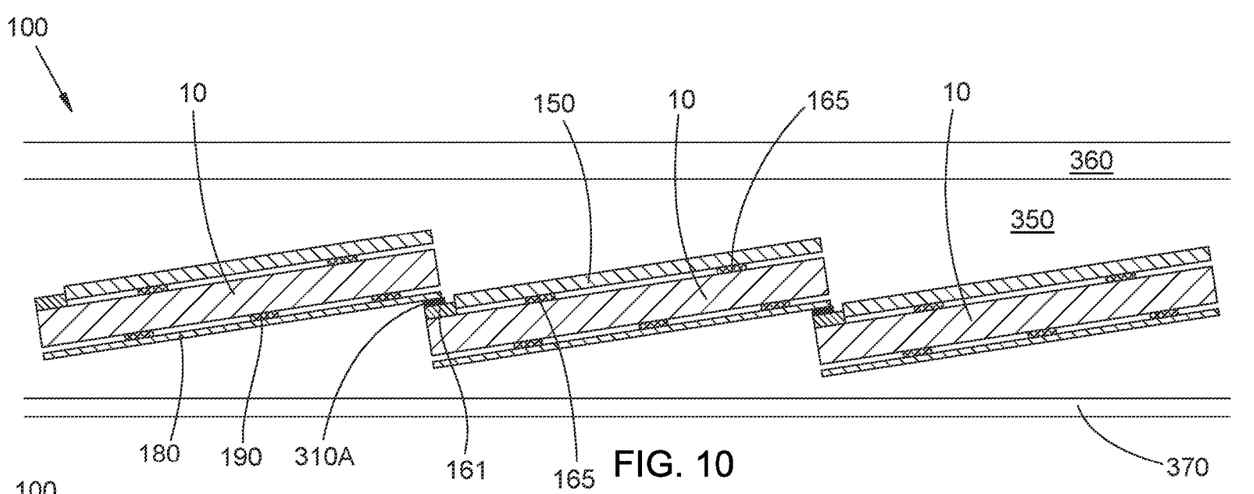
FIG. 10 shows a cross-sectional view of the string of solar cells arranged in a shingled manner.

FIG. 10 shows solar cells having a front side configuration shown in FIG. 12A and a rear side configuration shown in FIG. 2B arranged in a shingled manner. In this embodiment, the rear-side ribbon 180 of one solar cell contacts the front thin film pad 161 of an adjacent solar cell. Solder 310A may be used to make the connection between the rear-side ribbon and the front thin film pad. Alternatively, as in the embodiment of FIG. 7, contact with front thin film pad is made without the use of adhesive or solder or other materials to bond the rear-side ribbon to the front thin film pad. Instead, the lamination process pressing the solar cells against each other is enough to keep rear-side ribbon in contact with the front thin film pad of an adjacent solar cell without further use of adhesive or solder.

Figure 11:
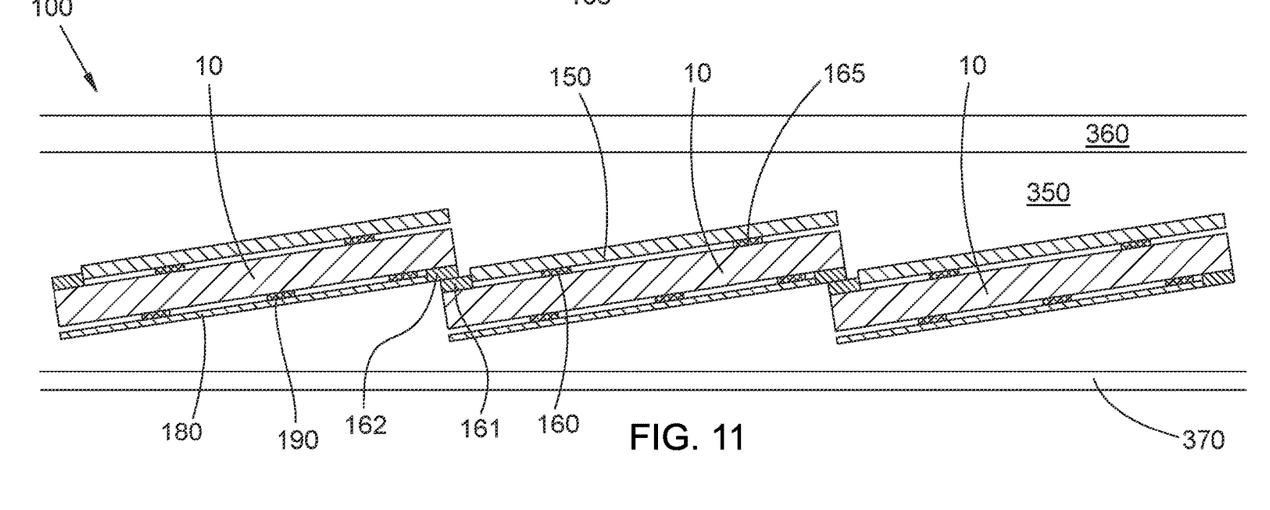
FIG. 11 shows a cross-sectional view of the string of solar cells arranged in a shingled manner.

FIG. 11 shows solar cells having a front side configuration shown in FIG. 12A and a rear side configuration shown in FIG. 12B arranged in a shingled manner. In this embodiment, the rear thin film pad 162 of one solar cell contacts the front thin film pad 161 of an adjacent solar cell. Solder, not shown, or other methods of bonding may be used to make the connection between the rear thin film pad and the front thin film pad.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention.

What is claimed is:

1. A method of shingling solar cells, the method comprising:
   providing a solar cell having a front metallization pattern and a rear metallization pattern;
   cutting the solar cell to form first and second solar cell strips so that each solar cell strip has a portion of the front metallization pattern and a portion of the rear metallization pattern of the solar cell;
   attaching front-side ribbons to the first solar cell strip so that the front-side ribbons contact the front metallization pattern of the first solar cell strip, attaching front-side ribbons to the second solar cell strip so that the front-side ribbons contact the front metallization pattern of the second solar cell strip;
   attaching rear-side ribbons to the first solar cell strip so that the rear-side ribbons contact the rear metallization pattern of the first solar cell strip, attaching rear-side ribbons to the second solar cell strip so that the rear-side ribbons contact the rear metallization pattern of the second solar cell strip, the rear-side ribbons are separate from the front-side ribbons, the rear-side ribbons having a cross-sectional width that is at least 2 times larger than a cross-sectional width of the front-side ribbons; and
   after attaching the front-side ribbons and after attaching the rear-side ribbons, assembling the first and second solar cell strips in a shingled manner to create an overlap area so that the rear-side ribbons extend into the overlap area and the front-side ribbons do not extend into the overlap area.

2. The method of claim 1, wherein before assembling the first and second solar cell strips and after cutting the solar cell, disposing a front pad on the first and second solar cell strips, the front pad comprising copper film coated with silver.

3. The method of claim 1, wherein attaching the front-side ribbons comprises applying and curing solder and attaching the rear-side ribbons comprises applying and curing solder, and wherein the step of curing solder to attach the front-side ribbons to the first solar cell strip and curing the solder to attach the rear-side ribbons to the first solar cell strip occurs at the same time.

4. The method of claim 1, wherein the assembling the first and second solar cell strips is done without the use of adhesive, solder, or other bonding agent.

5. The method of claim 1, wherein providing a solar cell comprises providing a MBB (Multi-busbar) solar cell.

6. The method of claim 5, wherein before assembling the first and second solar cell strips and after cutting the solar cell, disposing a front pad on the first and second solar cell strips, the front pad comprising copper film coated with silver.

* * * * *